(12) United States Patent
Nagao

(10) Patent No.: US 6,677,674 B2
(45) Date of Patent: Jan. 13, 2004

(54) SEMICONDUCTOR PACKAGE HAVING TWO CHIPS INTERNALLY CONNECTED TOGETHER WITH BUMP ELECTRODES AND BOTH CHIPS EXTERNALLY CONNECTED TO A LEAD FRAME WITH BOND WIRES

(75) Inventor: Koichi Nagao, Kyoto (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/170,136

(22) Filed: Jun. 12, 2002

(65) Prior Publication Data
US 2002/0192855 A1 Dec. 19, 2002

(30) Foreign Application Priority Data
Jun. 13, 2001 (JP) .......................... 2001-178104

(51) Int. Cl.⁷ .......................... H01L 23/49; H01L 21/60
(52) U.S. Cl. .................. 257/724; 257/777; 257/784; 257/787; 438/109; 438/123; 438/127
(58) Field of Search ................. 257/676, 723, 257/724, 737, 738, 777, 782, 784, 787; 438/107, 109, 123, 124, 127, 612, 613

(56) References Cited

U.S. PATENT DOCUMENTS

| | | | | |
|---|---|---|---|---|
| 5,793,108 A | * | 8/1998 | Nakanishi et al. | 257/723 |
| 6,051,886 A | * | 4/2000 | Fogal et al. | 257/777 |
| 6,057,598 A | * | 5/2000 | Payne et al. | 257/723 |
| 6,133,637 A | | 10/2000 | Hikita et al. | |
| 6,376,914 B2 | * | 4/2002 | Kovats et al. | 257/777 |
| 6,391,682 B1 | * | 5/2002 | Tsai et al. | 438/108 |
| 6,433,421 B2 | * | 8/2002 | Masuda et al. | 257/723 |
| 6,448,659 B1 | * | 9/2002 | Lee | 257/777 |
| 6,461,897 B2 | * | 10/2002 | Lin et al. | 438/109 |
| 2002/0027266 A1 | * | 3/2002 | Wada et al. | 257/666 |
| 2002/0195697 A1 | * | 12/2002 | Mess et al. | 257/686 |

FOREIGN PATENT DOCUMENTS

JP 10-256472 A 9/1998

* cited by examiner

Primary Examiner—Carl Whitehead, Jr.
Assistant Examiner—Stephen W. Smoot
(74) Attorney, Agent, or Firm—Merchant & Gould P.C.

(57) ABSTRACT

A semiconductor device includes a lead frame having a die pad and leads, a first semiconductor chip having first internal electrodes and first external electrodes and mounted on the die pad, a second semiconductor chip having second internal electrodes and second external electrodes and bonded to the first semiconductor chip with the surfaces facing each other, the first internal electrodes being connected to the respective first internal electrodes with bumps, first and second metal fine wires connecting between the leads and the respective first and second external electrodes, and sealing resin. Both semiconductor chips are shifted from each other with the edges being substantially in parallel, a part of the end portion of each semiconductor chip protrudes from the edge of the counterpart semiconductor chip and the external electrodes are located in the protruded regions. Regardless of the outside dimension of both semiconductor chips, it is possible to electrically connect the semiconductor chip to the lead frame effectively.

9 Claims, 8 Drawing Sheets

SEMICONDUCTOR PACKAGE HAVING TWO CHIPS INTERNALLY CONNECTED TOGETHER WITH BUMP ELECTRODES AND BOTH CHIPS EXTERNALLY CONNECTED TO A LEAD FRAME WITH BOND WIRES

FIELD OF THE INVENTION

The present invention relates to a semiconductor device having a semiconductor mounted structure in which a first LSI chip and a second LSI chip, each having LSI on the main surface, are bonded together with the main surfaces facing each other, and a method for manufacturing the same.

BACKGROUND OF THE INVENTION

In order to realize a low cost and a small size of a semiconductor integrated circuit device, a COC (Chip On Chip)-structured semiconductor device in which a semiconductor mounted structure is formed by bonding two LSI chips by a face-down bonding method has been proposed. In each LSI chip, for example, LSI having a different function or LSI made by a different process is formed. An example of such a semiconductor device will be explained with reference to FIG. 8.

Figure 8:
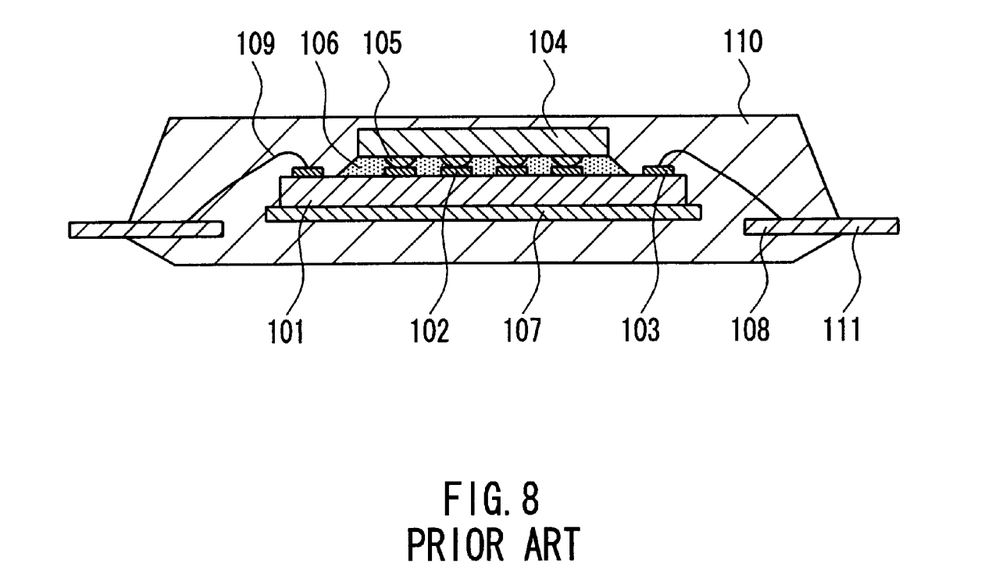
FIG. 8 is a cross-sectional view showing a semiconductor device of a prior art.

In the semiconductor device shown in FIG. 8, a first LSI chip 101 and a second LSI chip 104 are mounted. On the main surface of the first LSI chip 101 on which LSI (not shown) is formed, an internal electrode 102 and an external electrode 103 are formed. On the main surface of the second LSI chip 104 on which LSI (not shown) is formed, a bump 105 is formed. The first LSI chip 101 and the second LSI chip 104 are bonded together by a face-down bonding method in a state in which the internal electrode 102 is connected to the bump 105. Between the first LSI chip 101 and the second LSI chip 104, an insulating resin 106 is filled. The first LSI chip 101 is fixed to a die pad 107 of a lead frame by soldering. The external electrode 103 of the first LSI chip 101 is electrically connected to an inner lead 108 of the lead frame with a bonding wire 109 made of a metal fine wire. The first LSI chip 101, the second LSI chip 104, the die pad 107, the inner lead 108 and the bonding wire 109 are sealed with a sealing resin 110.

The above-mentioned semiconductor device is manufactured as follows. First, an insulating resin 106 is coated on the central portion of the first LSI chip 101, having the external electrodes 103 formed on the peripheral portions. Next, the second LSI chip 104 is pressed to the first LSI chip 101, and the first LSI chip 101 and the second LSI chip 104 are bonded together in a state in which the internal electrode 102 is connected to the bump 105.

Next, the external electrode 103 of the first LSI chip 101 is connected to the inner lead 108 of the lead frame with a bonding wire 109. Next, the first LSI chip 101, the second LSI chip 104, the die pad 107, the inner lead 108 and the bonding wire 109 are sealed with the sealing resin 110. Finally, an outer lead 111 of the lead frame, which protrudes from the sealing resin 110, is shaped. Thus, a semiconductor device is completed.

However, in the configuration of the above-mentioned semiconductor device, when the outside dimension of the second LSI chip 104 is larger than that of the first LSI chip 101 located at the lower side, there may arise a structural limitation in fabricating a semiconductor device by mounting on the lead frame. In particular, it becomes difficult to connect the external electrode 103 of the first LSI chip 101 to the inner lead 108 of the lead frame with the bonding wire 109.

For example, in the case where a memory chip is used for the second LSI chip 104 located at the upper side, with increases in the capacity of the memory chip in the future, the outside dimension of the chip also is increased. On the other hand, in the case where a logic chip is used for the first LSI chip 101 located at the lower side, as the processing becomes finer, the outside dimension of the chip is reduced. Consequently, the outside dimension of the memory chip becomes larger than that of the logic chip. In such a case, the above-mentioned problem becomes significant in the high-density semiconductor mounting technique.

Figure 9:
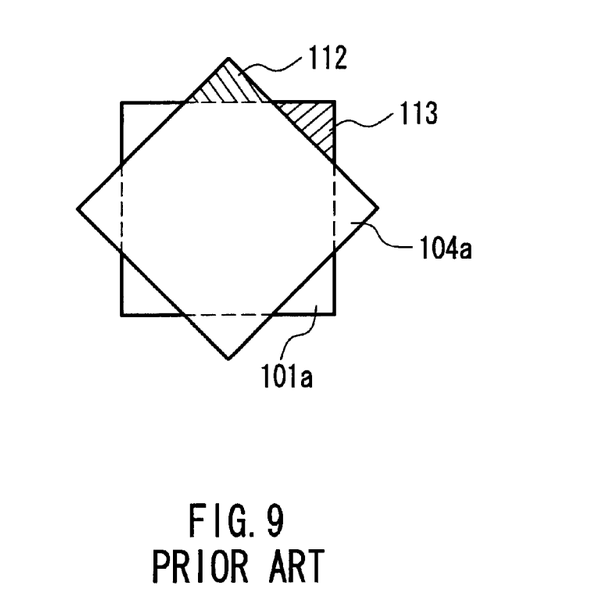
FIG. 9 is a schematic plan view showing an arrangement of chips constituting a semiconductor device in a prior art.

In the meanwhile, JP 10(1998)-256472 A discloses a semiconductor device having a structure shown in FIG. 9. A second LSI chip 104a has the same outside dimension as that of a first LSI chip 101a located at the lower side. The chips are bonded together while rotated at an angle of 45° relative to each other. Therefore, corner portions 112 and 113 of the both chips, which are shown in a hatch pattern, are exposed without overlapping. By providing these corner portions 112 and 113 with external electrodes (not shown), wiring is made possible regardless of the increase in the outside dimension of the second LSI chip 104.

However, in the wiring using such corner portions 112 and 113, since the number of the usable external electrodes extremely is limited, it is difficult to carry out satisfactory electrical connection. The reason is that with the mutual rotation of the chips, the exposed area is small. Furthermore, when considering that the insulating resin filled between the chips may protrude from the edge of the chip to form a so-called fillet, the margin of usable exposed area becomes further reduced.

SUMMARY OF THE INVENTION

With the foregoing in mind, it is an object of the present invention to provide a semiconductor device capable of effectively connecting between the semiconductor chip and the lead frame even in a COC structure in which the outside dimension of the semiconductor chip located at the upper side is larger than that of the semiconductor chip located at the lower side, and a method for manufacturing the same.

The semiconductor device of the present invention includes a lead frame having a die pad and leads provided in the vicinity of the die pad, a first semiconductor chip having first internal electrodes and first external electrodes on a surface thereof and mounted on the die pad, a second semiconductor chip having second internal electrodes and second external electrodes on a surface thereof and bonded to the first semiconductor chip with the surfaces facing each other, the second internal electrodes being connected to the respective first internal electrodes with bumps, first metal fine wires for connecting the leads to the respective first external electrodes and second metal fine wires for connecting the leads to the respective second external electrodes, and a sealing resin for sealing the leads, the first and second semiconductor chips and the first and second metal fine wires. The first semiconductor chip is superimposed onto the second semiconductor chip with the edges being shifted from each other while the edges are in parallel to each other, whereby a part of the end portions of the first and second semiconductor chip protrude from the edge of the counterpart semiconductor chips and the first and the second external electrodes are located in the protruded regions respectively.

With such a configuration, since the external electrodes are exposed without overlapping, the leads of the lead frame can be connected to the external electrodes with the metal fine wires without problems. It is noted that the condition of the edges being substantially in parallel may include the state such that the edges cross each other at an angle within an alignment accuracy in the COC mounting process. Specifically, if the angle between the edges is within ±1 degree, a practically sufficient effect can be achieved.

Furthermore, the semiconductor device may have a configuration in which a pair of opposite end portions of the first semiconductor chip protrude from the edge of the second semiconductor chip, and a pair of opposite end portions of the second semiconductor chip protrude from the edge of the first semiconductor chip. With such a configuration, it is possible to laminate a memory element that is a rectangular-shaped chip in most cases and a system LSI, etc. easily and simply. Note here that since the memory element has a structure in which electrode pads are disposed on both end portions in two sides in most cases, the existing memory elements easily can be used.

Alternatively, the semiconductor device may have a configuration in which one end portion of the first semiconductor chip protrudes from the edge of the second semiconductor chip and three end portions of the second semiconductor chip protrude from the edge of the first semiconductor chip. With such a configuration, it is possible to connect the first semiconductor chip and the second semiconductor chip partially via the bump in order to make shortest the electrical path between the first semiconductor chip 4 and the second semiconductor chip.

Alternatively, the semiconductor device may have a configuration in which the first semiconductor chip and the second semiconductor chip are arranged so as to be shifted from each other substantially in the diagonal direction and thereby two adjoining end portions of the first semiconductor chip and two adjoining end portions of the second semiconductor chips protrude from the edge of the chips. With such a configuration, it is possible to laminate square shaped chips easily and simply.

In the configuration, in the above-mentioned configuration, it is preferable that an insulating resin is filled in a gap between the first semiconductor chip and the second semiconductor chip, the end of the insulating resin is projected outward from the end of the first semiconductor chip or the second semiconductor chip to form a fillet, and the first and second external electrodes are located outside of the end of the fillet. Thus, it is possible to use the areas of the first and second electrodes effectively.

In order to do so, the semiconductor device may have a configuration in which in the portion where the first semiconductor chip/the second semiconductor chip protrudes, the total thickness t of the thickness of the first semiconductor chip/the second semiconductor chip and the thickness of the insulating resin, and the distance L between the edge of the second semiconductor chip/the first semiconductor chip and the inside edge of the first external electrode/the second external electrode satisfy the relationship: t<L.

Practically, it is preferable that the distance between the protruding end of the second semiconductor chip/the first semiconductor chip and the edge of the first semiconductor chip/the second semiconductor chip is in the range from 0.3 mm to 2.0 mm.

The semiconductor device may have a configuration in which the first semiconductor chip is a logic chip or an analog chip and the second semiconductor chip is a memory chip having a larger outside dimension than the outside dimension of the first semiconductor chip. In this case, the semiconductor device may have a configuration in which the second semiconductor chip has at least one side longer than the side of the first semiconductor chip.

According to the method for manufacturing a semiconductor device of the present invention, onto a first semiconductor chip having first internal electrodes and first external electrodes on a main surface thereof, a second semiconductor chip having second internal electrodes and a second external electrodes on a main surface thereof is superimposed with the main surfaces facing each other to form a semiconductor mounted structure, the chips are bonded together, and the semiconductor mounted structure is mounted on a lead frame. This method includes forming the semiconductor mounted structure by superimposing the first semiconductor chip onto the second semiconductor chip with the edges being shifted from each other, while the edges are substantially in parallel to each other, whereby a part of the end portions of the first and the second semiconductor chips protrude from the edge of the counterpart semiconductor chip, and the first and the second external electrodes are located at the protruded regions respectively, and connecting the first internal electrodes to the respective second internal electrodes with bumps, mounting and adhering the semiconductor mounted structure on the lead frame having a die pad and leads provided in the vicinity of the die pad with the first semiconductor chip contacting with the surface of the die pad, connecting the first and second external electrodes to the respective leads with the first and the second metal fine wires respectively, and sealing a part of the lead of the lead frame, the semiconductor mounted structure, the first metal fine wires and the second metal fine wires with a sealing resin.

According to this manufacturing method, an external electrode of each semiconductor chip can be connected effectively to a lead with a metal fine wire.

DETAILED DESCRIPTION OF THE INVENTION (First Embodiment)

A semiconductor device according to a first embodiment will be explained with reference to the drawings.

Figure 1A:
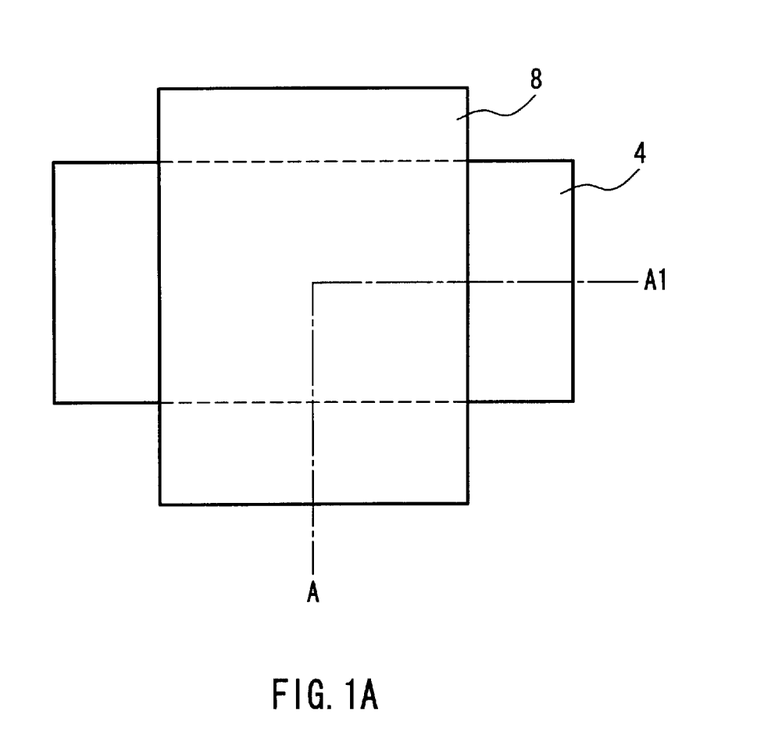
FIG. 1A is a plan view showing a semiconductor mounted structure constituting a semiconductor device in one embodiment of the present invention.

First, a semiconductor mounted structure assembled into a semiconductor device of this embodiment will be explained with reference to FIG. 1. FIG. 1A is a schematic plan view showing a state of chips of the semiconductor mounted structure in this embodiment; and FIG. 1B is a cross-sectional view of FIG. 1A along the line A–A1.

Figure 1B:
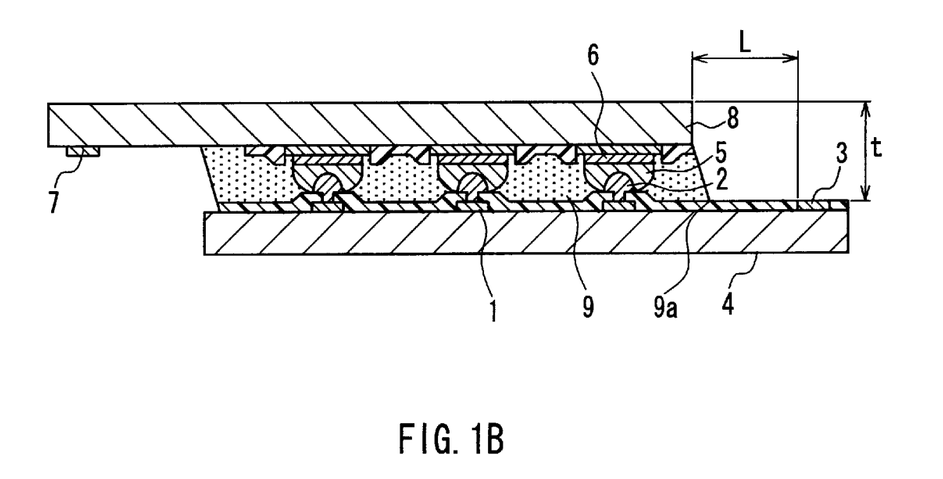
FIG. 1B is a cross-sectional view of FIG. 1A along a line A–A1.

As shown in FIG. 1B, the semiconductor mounted structure of this embodiment has a COC structure including a first semiconductor chip 4 and a second semiconductor chip 8 bonded to the first semiconductor chip 4 with the main surfaces facing each other. The first semiconductor chip 4 includes a first internal electrode 1 formed on the main surface, a first bump 2 formed on the first internal electrode 1 and a first external electrode 3 formed on the peripheral portion of the chip 4 and connected to the first internal electrode 1. The second semiconductor chip 8 includes a second internal electrode 6 formed on the main surface, a second bump 5 formed on the second internal electrode 6 and a second external electrode 7 formed on the peripheral portion of the chip 8 and connected to the second internal electrode 6. The internal electrode 1 of the first semiconductor chip 4 is electrically connected to the internal electrode 6 of the second semiconductor chip 8 via bonding of the first bump 2 and the second bump 5. In a gap between the first semiconductor chip 4 and the second semiconductor chip 8, an insulating resin 9 is filled as an under-fill material.

As shown in FIG. 1A, this COC structure of the semiconductor mounted structure is formed in a state in which the longitudinal side of the second semiconductor chip 8 is arranged perpendicular to the longitudinal side of the first semiconductor chip 4. Therefore, both end portions of the first semiconductor chip 4 in the longitudinal direction protrude from the side edges of the second semiconductor chip 8 and both end portions of the second semiconductor chip 8 in the longitudinal direction protrude from the side edges of the first semiconductor chip 4. Thereby, the first external electrode 3 of the first semiconductor chip 4 and the second external electrode 7 of the second semiconductor chip 8 are exposed, respectively. Therefore, when the semiconductor mounted structure is mounted on the lead frame, the first external electrode 3 and the second external electrode 7 can be connected to the leads with metal fine wires without difficulty.

The protruding length of the end portions of the semiconductor chips 4 and 8 should be determined while considering that the resin 9 filled between both chips protrudes to form a fillet as shown in FIG. 1B. That is, it is necessary to set the protruding length of the end portion of the semiconductor chip so that the first external electrode 3 is located outside of the end 9a of the fillet. It is similar for the second external electrode 7.

Although not shown in FIG. 1B, it is known that in general the largest protrusion distance of the end 9a of the fillet outward from the edge of the semiconductor chip 8 approximately corresponds to the thickness t which is a total thickness of the semiconductor chip 8 and the resin 9. Therefore, when t<L is satisfied, wherein L denotes the distance between the edge of the semiconductor chip 8 and the inside edge of the first external electrode 3, the first external electrode 3 can be located surely outside of the end 9a of the fillet.

Specifically, it is preferable that the protruding distance is in the range from 0.3 mm to 2.0 mm from the edge of the counterpart semiconductor chip, in order to obtain a practically satisfactory effect. That is, if it is 0.3 mm or more, a pad of the external electrode can be exposed at the protruded portion. If it is more than 2.0 mm, the efficiency of housing semiconductor chips in a semiconductor device becomes poor, impairing the practicality.

The second external electrode 7 of the second semiconductor chip 8 may be an electrode for inputting/outputting from/to the outside, which is laid out by re-wiring from the second internal electrode 6 to the peripheral portion of the chip, and may be formed in the stage of the diffusing process or the stage of the mounting process. Specifically, for example, a wiring is formed of copper on the insulating resin film made of polyimide etc. and an electrode portion is composed of nickel (Ni) and gold (Au).

Furthermore, as one example, the first semiconductor chip 4 may be a logic chip and the second semiconductor chip 8 may be a memory chip having an outside dimension larger than that of the first semiconductor chip 4. On the first semiconductor chip 4, in addition to the logic circuit, an analog circuit or a small-capacity memory may be formed.

FIG. 1B shows a state in which the second bump 5 is larger than the first bump 2 and the rigidity of the first bump 2 is higher than that of the second bump 5, and thus the first bump 2 penetrates into the second bump 5. As the second bump 5, a binary solder bump containing tin (Sn) and silver (Ag) can be used. As a specific example of the bump, a Su-3.5Ag solder bump containing 96.5[%] of tin (Sn) and 3.5[%] of silver (Ag) may be used. As the first bump 2, for example, a nickel (Ni) bump may be used. A nickel (Ni) bump preferably has a small amount of gold (Au) layer formed on the surface. The nickel bump composing the first bump 2 penetrates into and is bonded to the solder bump that is the second bump 5, and an alloy layer containing nickel and tin is formed on the interface of bonding.

The first bump 2 may be a binary solder bump containing tin (Sn) and silver (Ag) similarly to the second bump 5.

Figure 2:
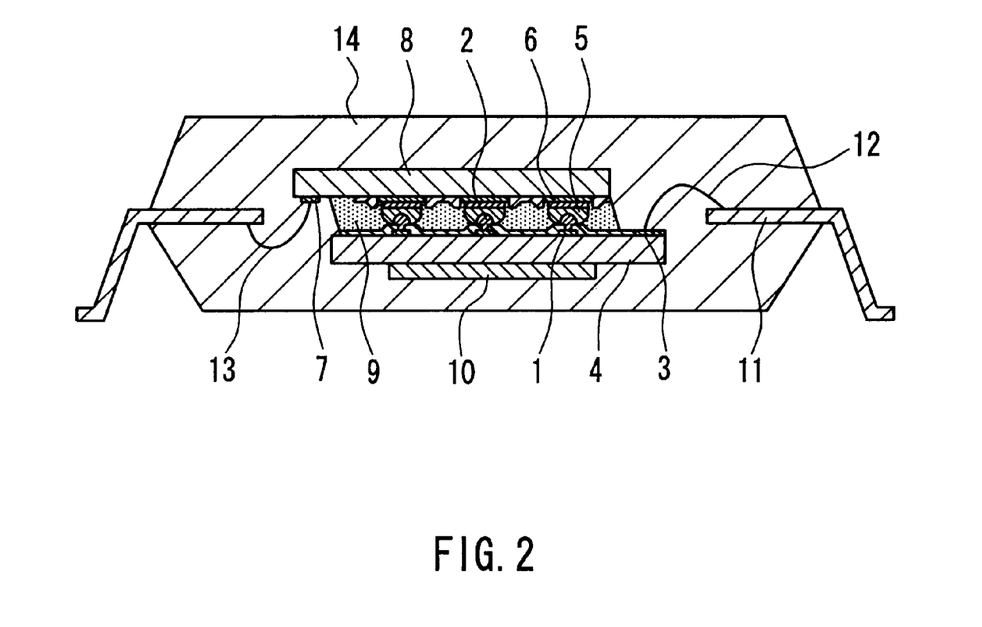
FIG. 2 is a cross-sectional view showing the semiconductor device fabricated by using the semiconductor mounted structure.

The following is an explanation about the configuration in which the above-mentioned semiconductor mounted structure is mounted on a lead frame to assemble a semiconductor device. FIG. 2 is a cross-sectional view showing the basic part of the semiconductor device of this embodiment.

The above-mentioned semiconductor mounted structure is mounted on the die pad 10 of the lead frame with the first semiconductor chip 4 contacting thereto. The surface of the lead 11 of the lead frame is connected to the first external electrode 3 of the first semiconductor chip 4 with a first metal fine wire 12. The rear surface of the lead 11 is connected to the second external electrode 7 of the second semiconductor chip 8 with a second metal fine wire 13. As mentioned above, since the first external electrode 3 and the second external electrode 7 are exposed at the protruded end portion of the semiconductor chips 4 and 8, the connection with the first metal wire 12 and the second metal wire 13 is possible. The lead 11, the first semiconductor chip 4, the second semiconductor chip 8, the first metal wire 12 and the second metal wire 13 are sealed with the sealing resin 14.

As mentioned above, the semiconductor device of this embodiment is formed as a small package in which two functional chips are built in efficiently. Furthermore, the second external electrodes 7 of the second semiconductor chip 8 are efficiently formed external electrodes, which are arranged on the peripheral portion of the chip laid out via re-wiring in the mounting process. Therefore, even if a logic chip is used for the first semiconductor chip 4 located at the lower side and a memory chip having a larger external area than that of the chip located at the lower side is used for the second semiconductor chip 8 located at the upper side, efficient electrical connection in the COC structure can be achieved. Furthermore, in the semiconductor mounted structure sealed inside the package, the connection between chips is strong, the stability of the connection under high temperatures is secured and the reliability is high. As one example, when it was maintained at 150[° C.], the deterioration in the connection over time did not occur, and thus it was confirmed that the connection between the chips was stable.

Although the configuration of the semiconductor device having the QFP (Quad Flat Package) structure is explained in this embodiment, any desired semiconductor package to be employed may be selected.

Next, a method for manufacturing the above-mentioned semiconductor device will be explained. FIGS. 3A to 3D, FIGS. 4A to 4C and FIGS. 5A to 5C are cross-sectional views showing main processes in the manufacturing method in the semiconductor device in this embodiment. FIGS. 3A to 3D and FIGS. 4A to 4C show a method for manufacturing a semiconductor mounted structure; and FIGS. 5A to 5C show a method for manufacturing a resin-sealed semiconductor device by using the semiconductor mounted structure.

First, with reference to FIGS. 3A to 3D and FIGS. 4A to 4C, a method for manufacturing the semiconductor mounted structure will be explained. FIGS. 3A to 3D show only a part of the semiconductor chip. In the actual state, the first semiconductor chip 4 and the second semiconductor chip 8 are prepared as part of a wafer provided with several chips.

Figure 3A:
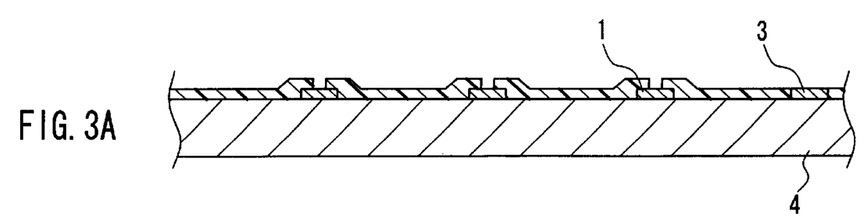
FIGS. 3A to 3D are cross-sectional views showing a manufacturing process according to a method for manufacturing a semiconductor device in one embodiment of the present invention.

As shown in FIG. 3A, the first semiconductor chip 4 is prepared, having the first internal electrode 1 on almost the central region on a main surface and the first external electrode 3 on the peripheral region on a main surface.

Figure 3B:
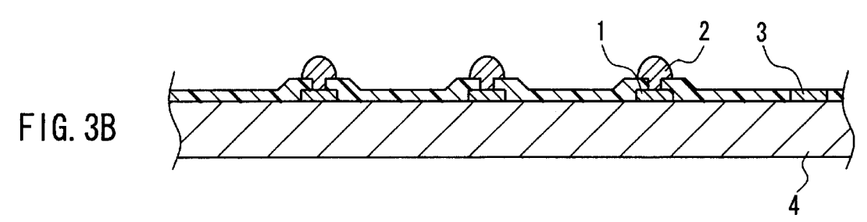

Next, as shown in FIG. 3B, the first bump 2 is formed so as to be connected to the first internal electrode 1. The first bump 2 has a higher rigidity and a smaller diameter than the below-mentioned first bump 5 of the semiconductor 8 and may be formed by electroless plating. As one example, a nickel (Ni) bump provided with a small amount of gold (Au) layer on the surface thereof may be formed. Furthermore, the rear surface may be subjected to back-grinding in the wafer state to have a predetermined thickness. Then, the semiconductor wafer provided with several semiconductor chips 4 on the surface is cut by dicing and thus each piece of the first semiconductor chip 4 is obtained.

As the first bump 2, a barrier layer containing titanium (Ti), copper (Cu) and nickel (Ni) and a binary solder bump containing tin (Sn) and silver (Ag) may be formed by electrolytic plating.

Figure 3C:
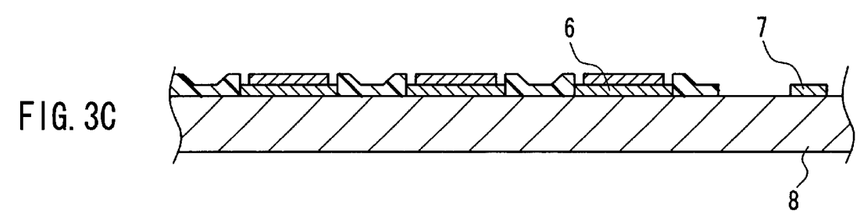

Furthermore, as shown in FIG. 3C, the second semiconductor chip 8 is prepared. The second semiconductor chip 8 has the second internal electrode 6 on almost the central region of a main surface and the second external electrode 7 connected to the second internal electrode 6 via re-wiring on the peripheral region of the main surface. Although not shown in the drawings, the second external electrode 7 is formed during the mounting process of the second semiconductor chip, by laying out the wiring from the second internal electrode 6 to the peripheral portion of the chip. It means that since the external electrode is laid out by a re-wiring technique in the stage of the mounting process, a desired external electrode can be formed suitably for the first semiconductor chip 4 to be connected by the COC. Therefore, in the stage of the diffusing process, the configuration of the second semiconductor chip can commonly be used.

Figure 3D:
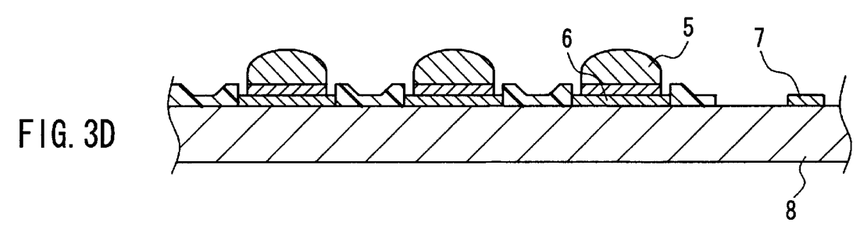

Next, as shown in FIG. 3D, on the internal electrode 6 of the second semiconductor chip 8 in the wafer state, the second bump 5 is formed. As the second bump 5, a barrier layer containing titanium (Ti), copper (Cu) and nickel (Ni) and a binary solder bump containing tin (Sn) and silver (Ag) are formed by electrolytic plating. More specifically, for example, a Sn-3.5 Ag solder bump containing 96.5[%] of tin (Sn) and 3.5[%] of silver (Ag) is formed. Furthermore, the rear surface is subjected to back-grinding in a wafer state to have a predetermined thickness. Furthermore, the semiconductor wafer on which several numbers of the second semiconductor chips 8 formed on the surface are cut by dicing so as to obtain each piece of the second semiconductor chip 8.

Figure 4A:
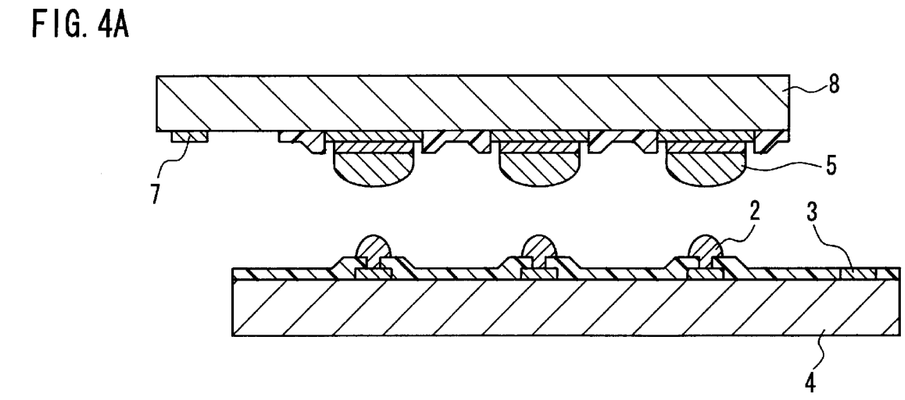
FIGS. 4A to 4C are cross-sectional views showing a manufacturing process following the process shown in FIG. 3D.
Figure 5A:
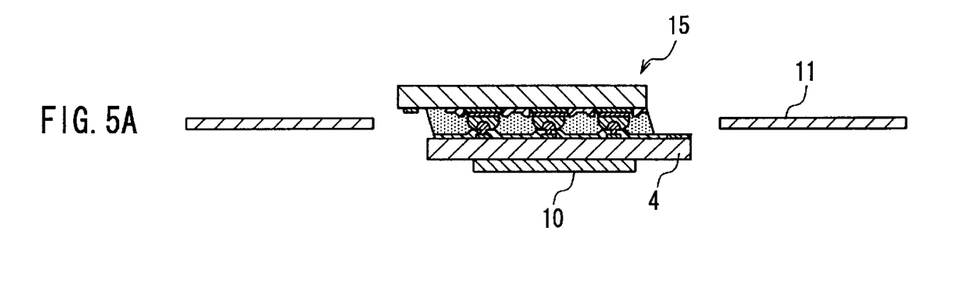
FIGS. 5A to 5C are cross-sectional views showing a manufacturing process following the process shown in FIG. 4C.
Figure 5B:
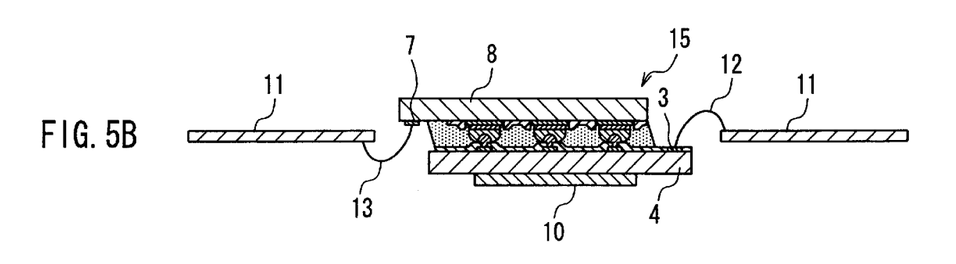
Figure 5C:
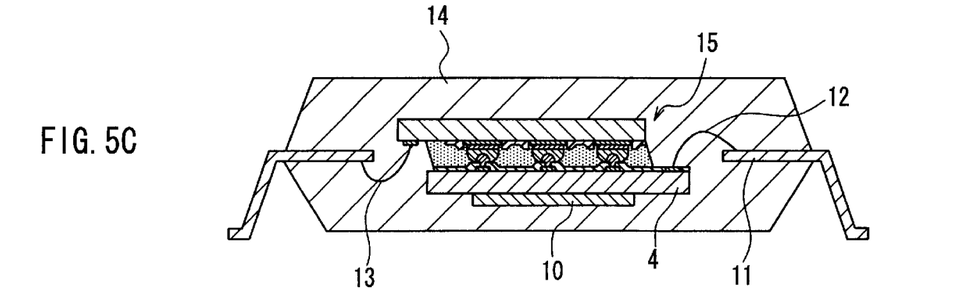

As shown in FIG. 4A, by using a flip chip bonder (not shown in the drawings), the main surface of the first semiconductor chip 4 on which the first bump 2 is formed and the main surface of the second semiconductor chip 8 on which the second bump 5 is formed face each other, whereby the first and second bumps 2 and 5 are positioned with respect to each other. The positional relationship between the superimposed chips is arranged to be a state in which a longitudinal side of the second semiconductor chip 8 is perpendicular to the longer side of the first semiconductor chip 4, thus realizing a state in which both end portions of the second semiconductor chip 8 protrude from the side edges of the first semiconductor chip 4 and both end portions of the first semiconductor chip 4 protrude from the side edges of the second semiconductor chip 8.

Figure 4B:
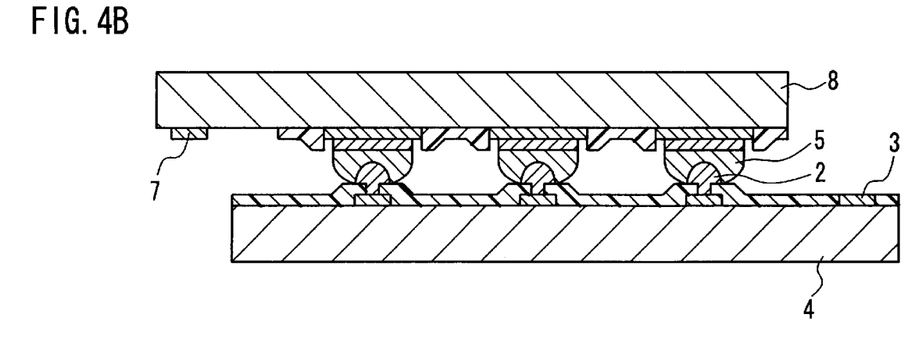

As shown in FIG. 4B, the first semiconductor chip 4 and the second semiconductor chip 8 are pressed to each other and heated by using a tool, whereby the first bump 2 of the first semiconductor chip 4 penetrates into the second bump 5 of the second semiconductor chip 8 and the first bump 2 and the second bump 8 are bonded together.

Figure 4C:
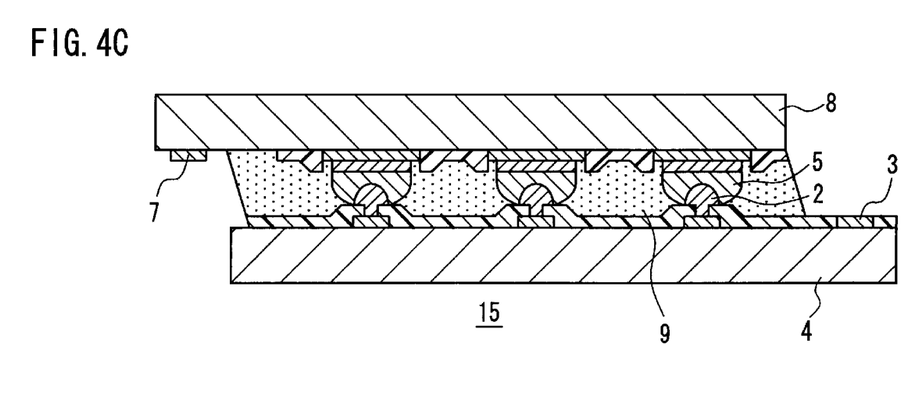

As shown in FIG. 4C, an insulating resin 9 as an underfill material is poured into a gap between the first semiconductor chip 4 and the second semiconductor chip 8 in order not to coat the external first electrode 3 and the second external electrode 7 and thermally cured, thus sealing the gap. Consequently, it is possible to form a semiconductor mounted structure 15 in which both end portions of the first semiconductor chip 4 and both end portions of the second semiconductor chip 8 are protruded from the side edges each other.

Next, a process for manufacturing a semiconductor device by using the semiconductor mounted structure formed as mentioned above will be explained with reference to FIGS. 5A to 5C.

First, as shown in FIG. 5A, a lead frame having at least a die pad 10 for supporting a semiconductor chip and leads 11 with the tips facing the die pad 10 are prepared. The semiconductor mounted structure 15 is mounted on this lead frame so that the bottom surface of the first semiconductor chip 4 contacts with the surface of the die pad 10 and is fixed thereto by using adhesives.

Next, as shown in FIG. 5B, the first external electrode 3 of the first semiconductor chip 4 is electrically connected to the surface of the lead 11 with a first metal fine wire 12 and at the same time the second external electrode 7 of the second semiconductor chip 8 is electrically connected to the rear surface of the lead 11 with a second metal fine wire 13.

Next, as shown in FIG. 5C, the surrounding portion of the die pad 10, the semiconductor mounted structure 15 and the metal fine wires 12 and 13 except for a part of the lead 11, i.e., an outer portion is sealed with a sealing resin 14.

Finally, a portion of the lead 11 protruding from the sealing resin 14 is cut off and shaped. Thus, a QFP type COC-structured semiconductor device is completed.

Note here that the method for manufacturing the semiconductor device of this embodiment is particularly effective in the case where a logic chip is used for the first semiconductor chip and a memory chip having an external area larger than that of the first semiconductor chip is used for the second semiconductor.

Figure 6A:
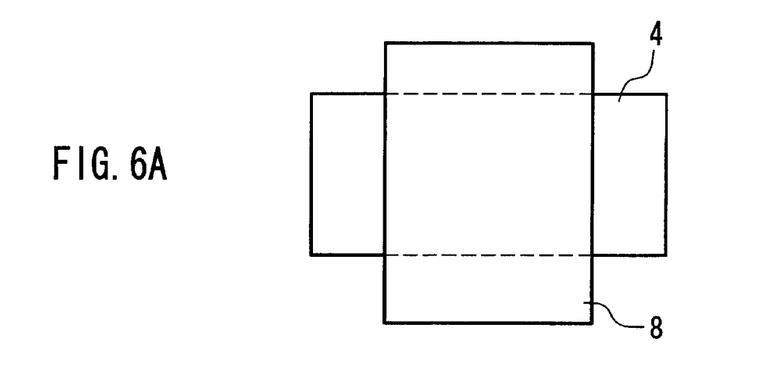
FIGS. 6A to 6C are schematic plan views showing examples of an arrangement of chips constituting a semiconductor device in the embodiments of the present invention.
Figure 6B:
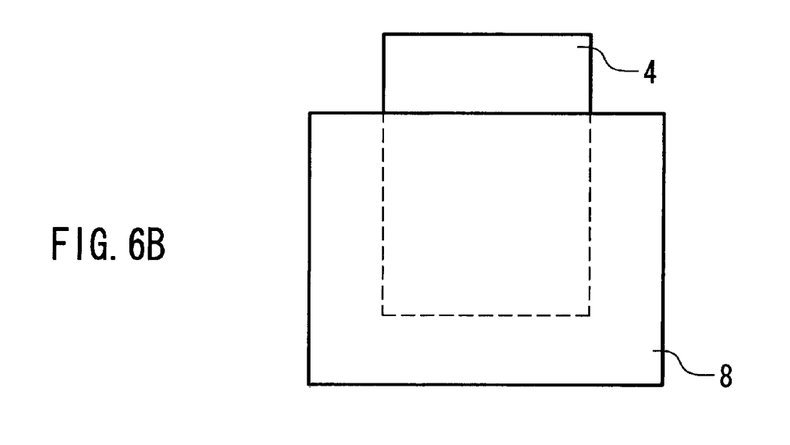
Figure 6C:
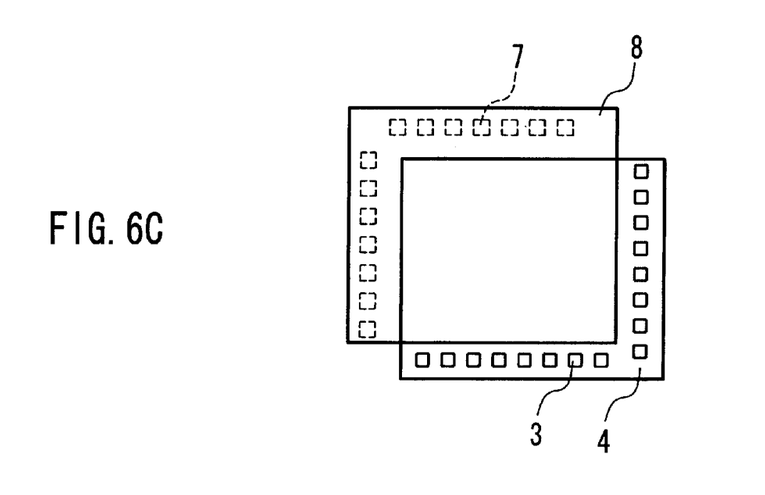

The following is an explanation about a typical example of the size relationship of semiconductor chips constituting the semiconductor mounted structure and the superimposing relationship of the chips in the case of applying the configuration of the semiconductor device and the method for manufacturing thereof in this embodiment, with reference to FIGS. 6A to 6C. In any of the configurations, the sides of the first semiconductor chip 4 and the sides of the second semiconductor chip 8 are arranged substantially in parallel.

First, the configuration shown in FIG. 6A is the same as that shown in FIG. 1A. This configuration is an example suitable for the case where the size of one semiconductor chip 4 or 8 in the longitudinal direction is larger than the size of the other semiconductor chip 8 or 4 in the total dimension. According to this configuration, it is possible to laminate a memory element having a rectangular-shaped chip in most cases and a system LSI etc. easily and simply. Note here that since the memory element has a structure in which electrode pads are disposed on both ends in most cases, the existing memory element easily can be used.

The configuration shown in FIG. 6B is an example suitable for the case where the outside dimension of the second semiconductor chip 8 is larger than that of the first semiconductor chip 4 as a whole. The first semiconductor chip 4 is shifted from the second semiconductor chip 8 so that one end of the first semiconductor chip 4 protrudes from the edge of the second semiconductor chip 8. In the second semiconductor chip 8, three ends protrude from the edge of the counterpart semiconductor chip. According to this configuration, it is possible to connect the first semiconductor chip 4 and the second semiconductor chip 8 partially via the bump in order to make shortest the electrical path between the first semiconductor chip 4 and the second semiconductor chip 8.

The configuration shown in FIG. 6C is an example applicable even if the sizes of the two semiconductor chips are similar. The semiconductor chip 4 and the second semiconductor chip 8 are shifted from each other in the direction of the diagonal line. That provides the configuration in which two adjoining ends of the first semiconductor chips 4 and two adjoining ends of the second semiconductor chips 8 protrude from each other. According to this configuration, it is possible to laminate elements (GaAs, SiGeC, CMOS) having a square-shaped chip in most cases and being manufactured by a different process easily and simply. Furthermore, this configuration also has an advantage that by dividing the electrode pads on the four sides of the two semiconductor chips into two groups, one group can be used for an electrode pad for bump bonding and another can be used for an electrode pad for wire bonding. Thus, for example, in the semiconductor chip having the same electrode pad, it is possible to carry out the wire bonding uniformly in all the directions and to avoid a difficult wiring.

In addition to the examples mentioned above, in accordance with the arrangement of the internal electrodes, and the arrangement of the external electrodes of each chip, other various kinds of chip laminating arrangements can be used. However, it is an essential condition to arrange the sides of the first semiconductor chip 4 and the sides of the semiconductor chip 8 substantially in parallel in order to achieve the effect of the present invention. By the condition, a sufficient exposed area for disposing the external electrodes can be obtained.

(Second Embodiment)

Figure 7A:
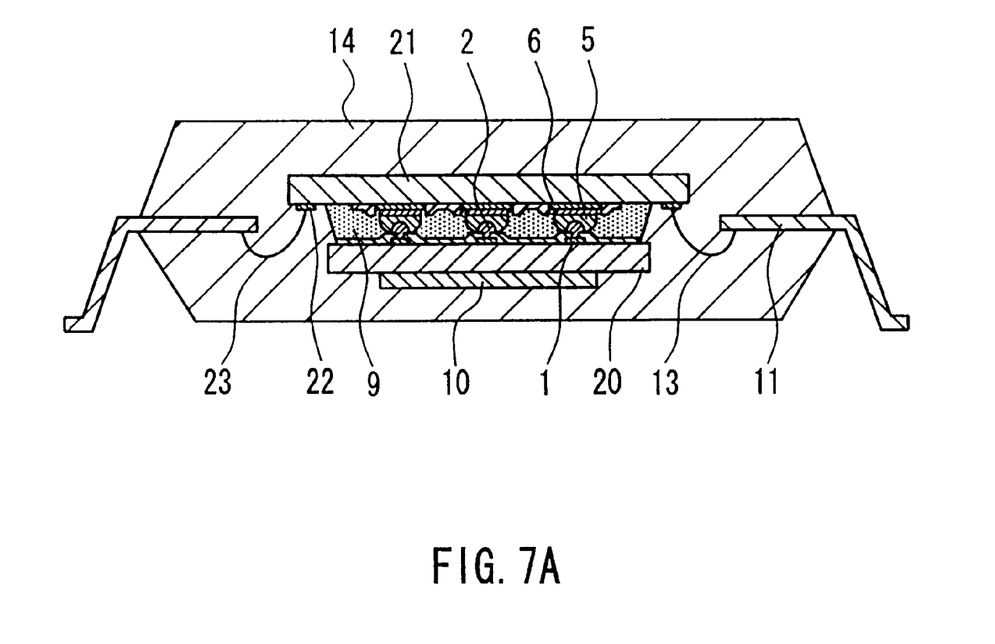
FIG. 7A is a cross-sectional view showing a semiconductor device in another embodiment of the present invention.

A semiconductor device of the second embodiment will be explained with reference to FIGS. 7A and 7B. FIG. 7A is a cross-sectional view showing a semiconductor device of this embodiment and FIG. 7B is a schematic plan view showing the relationship of the outside dimensions and a state of laminating the chips.

The semiconductor device of this embodiment has basically the same configuration as shown in FIG. 2. The semiconductor device of this embodiment is different from the semiconductor shown in FIG. 2 in the relationship between outside dimensions of two semiconductor chips 4, 8.

Figure 7B:
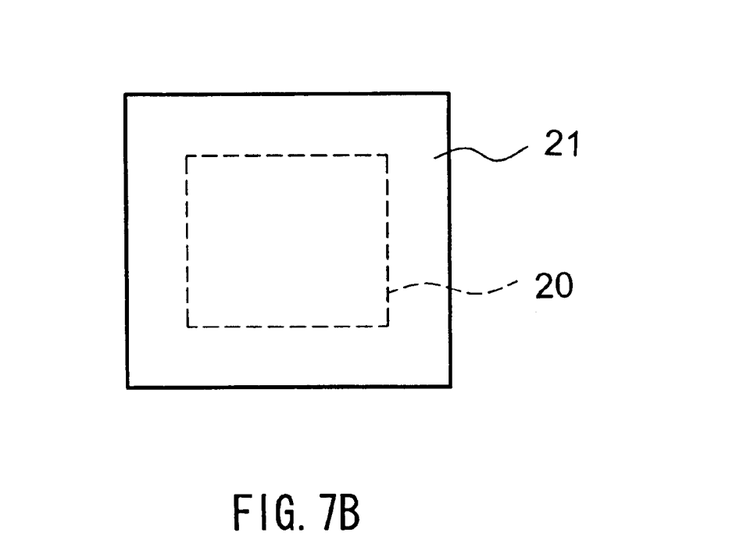
FIG. 7B is a schematic plan views showing an arrangement of chips constituting the semiconductor device shown in FIG. 7A.

In this embodiment, as shown in FIG. 7B, the size of the second semiconductor chip 21 is larger than the size of the first semiconductor chip 20 as a whole and all of the four ends protrude from the first semiconductor chip 20. Therefore, as shown in FIG. 7A, on the first semiconductor chip 20, an external electrode is not provided. In the second semiconductor chip 21, an external electrode 22 connected to the second internal electrode 6 is formed and exposed on peripheral portion.

The semiconductor mounted structure including the first semiconductor chip 20 and the second semiconductor chip 21 is mounted on the surface of the die pad 10 of the lead frame with the first semiconductor chip 20 contacting with the die pad 10. The rear surface of the lead 11 of the lead frame is connected to the external electrode 22 of the second semiconductor chip 21 with a metal fine wire 23.

Also in this embodiment, the first semiconductor chip 20 can be a logic chip and the second semiconductor chip 21 can be a memory chip. Furthermore, the external electrode 22 of the second semiconductor chip 21 may be an electrode for inputting/outputting from/to the outside, which is laid out by re-wiring to the peripheral portion of the chip from the second internal electrode 6. Thus, even if a memory chip having an outside dimension/external area larger than that of the chip located in the lower side is used, it is possible to realize the COC structure efficiently.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor device comprising:

a lead frame having a die pad and leads provided in the vicinity of the die pad, a first semiconductor chip having first internal electrodes and first external electrodes on a surface thereof and mounted on the die pad, a second semiconductor chip having second internal electrodes and second external electrodes on a surface thereof and bonded to the first semiconductor chip with the surfaces facing each other, the second internal electrodes being connected to the respective first internal electrodes with bumps, first metal fine wires for connecting the leads to the respective first external electrodes and second metal fine wires for connecting the leads to the respective second external electrodes, and a sealing resin for sealing the leads, the first and second semiconductor chips and the first and second metal fine wires, wherein:

the first semiconductor chip is superimposed onto the second semiconductor chip with corresponding edges being shifted from each other while the edges are substantially in parallel to each other, whereby a part of end portions of the first and second semiconductor chips protrude from the edge of the counterpart semiconductor chip and the first and the second external electrodes are located in the protruded regions respectively, an insulating resin is filled in a gap between the first and second semiconductor chips so that the ends of the insulating resin are projected outward from corresponding ends of the first and second semiconductor chips to form a fillet, with each edge of the insulating resin on the surface of the first or second semiconductor chip being positioned outside of the end of the counterpart semiconductor chip, and the first and second external electrodes are located outside of the end of the fillet.

2. The semiconductor device according to claim 1, wherein a pair of opposite end portions of the first semiconductor chip protrude from of the second semiconductor chip, and a pair of opposite end portions of the second semiconductor chip protrude from edges of the first semiconductor chip.

3. The semiconductor device according to claim 1, wherein one end portion of the first semiconductor chip protrudes from edge of the second semiconductor chip and three end portions of the second semiconductor chip protrude from edges of the first semiconductor chip.

4. The semiconductor device according to claim 1, wherein the first semiconductor chip and the second semiconductor chip are arranged so as to be shifted from each other substantially in a diagonal direction and thereby two adjoining end portions of the first semiconductor chip and two adjoining end portions of the second semiconductor chips protrude from adjoining edges of the chips.

5. The semiconductor device according to claim 1, wherein in the portion where the first semiconductor chip/ the second semiconductor chip protrudes, the total thickness t of the thickness of the first semiconductor chip/the second semiconductor chip and the thickness of the insulating resin, and the distance L between the edge of the second semiconductor chip/the first semiconductor chip and the inside edge of the first external electrode/the second external electrode satisfy the relationship: t<L.

6. The semiconductor device according to claim 1, wherein the distance between the protruding end of the second semiconductor chip/the first semiconductor chip and the edge of the first semiconductor chip/the second semiconductor chip is in the range from 0.3 mm to 2.0 mm.

7. The semiconductor device according to claim 1, wherein the first semiconductor chip is a logic chip or an analog chip and the second semiconductor chip is a memory chip having a larger outside dimension than the outside dimension of the first semiconductor chip.

8. The semiconductor device according to claim 7, wherein the second semiconductor chip has at least one side longer than a side of the first semiconductor chip.

9. A method for manufacturing a semiconductor device in which onto a first semiconductor chip having first internal electrodes and first external electrodes on a main surface thereof, a second semiconductor chip having second internal electrodes and second external electrodes on a main surface thereof is superimposed with the main surfaces facing each other to form a semiconductor mounted structure, the chips are bonded together, and the semiconductor mounted structure is mounted on a lead frame; the method comprising forming the semiconductor mounted structure by superimposing the first semiconductor chip onto the second semiconductor chip with corresponding edges shifted from each other, while the edges are substantially in parallel to each other, whereby a part of end portions of the first and the second semiconductor chips protrude from the edge of the counterpart semiconductor chip, and the first and the second external electrodes are located at the protruded regions respectively, and connecting the first internal electrodes to the respective second internal electrodes with bumps, filling in a gap between the first and second semiconductor chips with insulating resin so that the ends of the insulating resin are projected outward from corresponding ends of the first and second semiconductor chips to form a fillet, with each edge of the insulating resin on the surface of the first or second semiconductor chip being positioned outside of the end of the counterpart semiconductor chip, and the first and second external electrodes are located outside of the end of the fillet, mounting and adhering the semiconductor mounted structure on the lead frame having a die pad and leads provided in the vicinity of the die pad with the first semiconductor chip contacting with the surface of the die pad, connecting the first and second external electrodes to the respective leads with first and second metal fine wires respectively, and sealing a part of the leads of the lead frame, the semiconductor mounted structure, the first metal fine wires and the second metal fine wires with a sealing resin.

* * * * *